United States Patent
Strand et al.

(10) Patent No.: US 10,167,546 B2
(45) Date of Patent: Jan. 1, 2019

(54) SWELLABLE FILM FORMING COMPOSITIONS AND METHODS OF NANOIMPRINT LITHOGRAPHY EMPLOYING SAME

(71) Applicant: 3M INNOVATIVE PROPERTIES COMPANY, St. Paul, MN (US)

(72) Inventors: John T. Strand, Stillwater, MN (US); David B. Olson, Hudson, WI (US)

(73) Assignee: 3M INNOVATIVE PROPERTIES COMPANY, St. Paul, MN (US)

(*) Notice: Subject to any disclaimer, the term of this patent is extended or adjusted under 35 U.S.C. 154(b) by 0 days.

(21) Appl. No.: 15/558,384

(22) PCT Filed: Apr. 25, 2016

(86) PCT No.: PCT/US2016/029101
§ 371 (c)(1),
(2) Date: Sep. 14, 2017

(87) PCT Pub. No.: WO2016/176129
PCT Pub. Date: Nov. 3, 2016

(65) Prior Publication Data
US 2018/0080119 A1   Mar. 22, 2018

Related U.S. Application Data

(60) Provisional application No. 62/154,333, filed on Apr. 29, 2015.

(51) Int. Cl.
*C23C 14/34* (2006.01)
*G03F 7/00* (2006.01)
(Continued)

(52) U.S. Cl.
CPC ............ *C23C 14/34* (2013.01); *B05D 1/28* (2013.01); *B05D 3/007* (2013.01); *B05D 3/067* (2013.01);
(Continued)

(58) Field of Classification Search
None
See application file for complete search history.

(56) References Cited

U.S. PATENT DOCUMENTS 4,539,222 A * 9/1985 Anderson, Jr. ...... H01L 21/0272
216/40
4,828,964 A * 5/1989 Brunsvold ............. G03F 7/091
430/271.1
(Continued)

FOREIGN PATENT DOCUMENTS

| JP | 2008-218867 | 9/2008 |
|---|---|---|
| KR | 2011-0028600 | 3/2011 |
| KR | 2014-0139074 | 12/2014 |

OTHER PUBLICATIONS

International Search Report for PCT International Application No. PCT/US2016/029101, dated Aug. 8, 2016, 3pgs.

*Primary Examiner* — Allan W. Olsen
(74) *Attorney, Agent, or Firm* — James A. Baker

(57) ABSTRACT

Compositions of matter capable of being cast and cured to form a microreplicated pattern on a substrate, and further capable of swelling on exposure to water so as to release from that substrate. Water swellable acrylic polymers formed from these compositions, and methods of using same in nanoimprint lithography are also disclosed.

5 Claims, 1 Drawing Sheet

(51) Int. Cl.
*B05D 1/28* (2006.01)
*B05D 3/00* (2006.01)
*B05D 3/06* (2006.01)
*C23C 14/02* (2006.01)
*C23C 14/58* (2006.01)
*B29C 41/00* (2006.01)
*C08J 5/18* (2006.01)
*C08J 7/12* (2006.01)
*C08F 220/28* (2006.01)
*C09D 4/00* (2006.01)
*G03F 7/027* (2006.01)
*H01L 21/027* (2006.01)
*B29L 9/00* (2006.01)

(52) U.S. Cl.
CPC .......... *B29C 41/003* (2013.01); *C08F 220/28* (2013.01); *C08J 5/18* (2013.01); *C08J 7/12* (2013.01); *C09D 4/00* (2013.01); *C23C 14/021* (2013.01); *C23C 14/58* (2013.01); *G03F 7/0002* (2013.01); *G03F 7/027* (2013.01); *H01L 21/0272* (2013.01); *B29L 2009/008* (2013.01); *C08F 2220/286* (2013.01); *C08J 2333/14* (2013.01)

(56) References Cited

U.S. PATENT DOCUMENTS

| | | | |
|---|---|---|---|
| 5,185,055 A * | 2/1993 | Temple | B41J 2/1609 216/27 |
| 5,256,517 A | 10/1993 | Roeschert | |
| 5,626,994 A * | 5/1997 | Takayanagi | G02F 1/133512 430/25 |
| 6,027,630 A * | 2/2000 | Cohen | B81C 1/00126 205/135 |
| 6,180,742 B1 * | 1/2001 | Kato | H01L 21/302 526/328.5 |
| 6,217,945 B1 * | 4/2001 | Fowler | B05D 5/00 427/142 |
| 6,265,129 B1 * | 7/2001 | Takahashi | G03F 7/022 430/165 |
| 6,719,915 B2 | 4/2004 | Willson | |
| 7,165,959 B2 | 1/2007 | Humlicek | |
| 7,224,529 B2 | 5/2007 | King | |
| 7,417,798 B2 | 8/2008 | King | |
| 7,442,515 B2 * | 10/2008 | Ratner | G01N 33/545 435/7.2 |
| 7,527,357 B2 * | 5/2009 | Silverbrook | B41J 2/14314 347/54 |
| 7,804,649 B2 | 9/2010 | Eckhardt | |
| 8,163,188 B2 | 4/2012 | Carter | |
| 8,604,150 B2 | 12/2013 | Morinaka | |
| 9,375,873 B2 * | 6/2016 | Gracias | B01L 3/502707 |
| 9,389,511 B2 * | 7/2016 | Schwartz | G03F 7/16 |
| 2003/0006143 A1 * | 1/2003 | Banerjee | G03F 7/164 205/414 |
| 2003/0138842 A1 * | 7/2003 | Seul | G03F 7/164 435/7.1 |
| 2003/0165686 A1 | 9/2003 | Blackburn et al. | |
| 2003/0175624 A1 | 9/2003 | Nozaki et al. | |
| 2004/0007051 A1 * | 1/2004 | Bashir | C12Q 1/00 73/61.62 |
| 2005/0048414 A1 * | 3/2005 | Harnack | B82Y 30/00 430/322 |
| 2005/0069813 A1 | 3/2005 | Sawada | |
| 2005/0127032 A1 * | 6/2005 | Nakada | B82Y 10/00 216/41 |
| 2005/0169962 A1 * | 8/2005 | Bhatia | C12P 21/00 424/423 |
| 2006/0118514 A1 * | 6/2006 | Little | B82Y 30/00 216/41 |
| 2006/0246380 A1 | 11/2006 | Terai | |
| 2008/0220616 A1 | 9/2008 | Matsui | |
| 2008/0274431 A1 | 11/2008 | Nozaki | |
| 2009/0011141 A1 * | 1/2009 | Carter | B82Y 10/00 427/534 |
| 2009/0130607 A1 * | 5/2009 | Slafer | B82Y 10/00 430/323 |
| 2009/0266583 A1 * | 10/2009 | Nagasaki | C23C 18/2086 174/250 |
| 2010/0200538 A1 | 8/2010 | Petisce | A61B 5/0006 216/13 |
| 2014/0242632 A1 * | 8/2014 | Kim | G01N 33/5436 435/29 |
| 2014/0377951 A1 * | 12/2014 | Taddei | G03F 7/422 438/670 |
| 2015/0079523 A1 * | 3/2015 | Li | H01Q 1/2225 430/319 |

* cited by examiner

SWELLABLE FILM FORMING COMPOSITIONS AND METHODS OF NANOIMPRINT LITHOGRAPHY EMPLOYING SAME

CROSS REFERENCE TO RELATED APPLICATIONS

This application is a national stage filing under 35 U.S.C. 371 of PCT/US2016/029101, filed Apr. 25, 2016, which claims the benefit of U.S. Application No. 62/154,333, filed Apr. 29, 2015, the disclosure of which is incorporated by reference in its/their entirety herein.

FIELD

The present disclosure relates to film compositions capable of being swelled by the application of solvent, conveniently water. The present disclosure further provides methods for patterning surfaces using these compositions.

BACKGROUND

Nanoimprint lithography encompasses methods of fabricating nanometer scale features onto a substrate. Known methods include those where the features are embossed, and those where the features are micro replicated. When microreplication is pursued, it is known to employ a UV curable liquid resist for forming patterned conductive traces on the substrate. In the next step, the material at the bottom of the recessed features formed from the resist is etched away to expose the substrate. Subsequently, a metal layer is then deposited that covers the tops of the non-recessed patterned features as well as the exposed substrate. After the metal has been applied, it is necessary to remove (lift-off) the unneeded resist and metal overlay remaining on the substrate. This material is typically removed by selective etching, or washing in an organic solvent.

SUMMARY

The present disclosure provides unique UV curable acrylic resin compositions that can be coated using cast and cure techniques to yield microreplicated acrylic films on, e.g., a polyester substrate. These microreplicated films can be etched and metalized to give a patterned film, and finally the non-metalized excess acrylic film and over coated metal can be subsequently removed from the substrate using only a hot water wash, leaving a nano scale patterned film.

Thus, in one aspect, the present disclosure provides a composition of matter, comprising: a UV curable polymer precursor comprising between about 30 to 95 parts by weight of a mono-alkoxy polyalkylene glycol monoacrylate, with the remainder being mono-, di-, or tri-acrylate monomer species of various composition. One example of such a mono-, di-, or tri-acrylate monomer would be a polyalkelene glycol diacrylate monomer such as polyethylene glycol 400 diacrylate, another would be a hydroxy alkyl mono acrylate such as hydroxy ethyl acrylate, still another would be an ethoxylated Bisphenol A diacrylate. These compositions are readily cast and cured on convenient substrates, and yet the polymerized film will swell and lift off from those substrates when desired by means of a simple water wash.

In some embodiments, the mono-alkoxy polyakylene glycol monoacrylate has a molecular weight of above 500 Daltons.

In another aspect, the present disclosure provides a water swellable acrylic polymer formed by UV polymerization of the composition of matter just described.

In another embodiment, the present disclosure provides a method of forming a predetermined metalized pattern on a substrate, comprising: casting and curing a polymerizable precursor into a first side of the substrate so as to form a water swellable acrylic layer on the substrate, the water swellable acrylic layer having thick portions and thin portions such that the thin portions correspond to the predetermined pattern; etching the water swellable acrylic layer so that the thin portions are removed and substrate is partially exposed; metalizing the first side so as to deposit metal onto the exposed portions of the substrate and onto the thick portions of the water swellable acrylic layer; and exposing the water swellable acrylic layer to water, releasing the water swellable acrylic layer from the substrate and leaving the metalized pattern. It has been noted that best results with respect to lift-off are achieved when the water swellable acrylic layer is not too thin, with a thickness of at least about 0.3 microns being considered suitable, or even 1 micron, or even 3 microns.

Various aspects and advantages of exemplary embodiments of the present disclosure have been summarized. The above Summary is not intended to describe each illustrated embodiment or every implementation of the present disclosure. Further features and advantages are disclosed in the embodiments that follow. The Drawings and the Detailed Description that follow more particularly exemplify certain embodiments using the principles disclosed herein.

BRIEF DESCRIPTION OF THE DRAWINGS

The disclosure may be more completely understood in consideration of the following detailed description of various embodiments of the disclosure in connection with the accompanying figures, in which.

Figure 1:
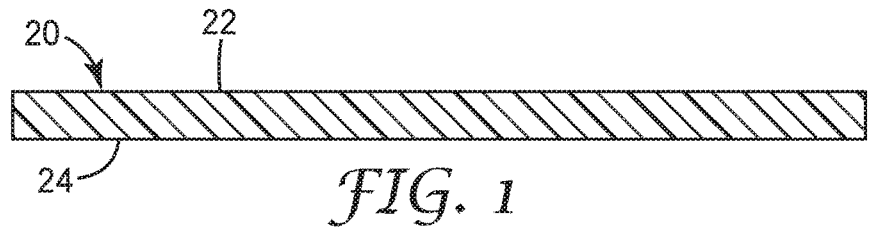
FIG. 1 is a side view of an exemplary substrate ready to receive a patterned coating of a swellable acrylic composition.

While the above-identified drawings, which may not be drawn to scale, set forth various embodiments of the present disclosure, other embodiments are also contemplated, as noted in the Detailed Description. In all cases, this disclosure describes the presently disclosed invention by way of representation of exemplary embodiments and not by express limitations. It should be understood that numerous other modifications and embodiments can be devised by those skilled in the art, which fall within the scope and spirit of this disclosure.

DETAILED DESCRIPTION

As used in this Specification, the recitation of numerical ranges by endpoints includes all numbers subsumed within that range (e.g. 1 to 5 includes 1, 1.5, 2, 2.75, 3, 3.8, 4, and 5, and the like).

Unless otherwise indicated, all numbers expressing quantities or ingredients, measurement of properties and so forth used in the Specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

For the following defined terms, these definitions shall be applied for the entire Specification, including the claims, unless a different definition is provided in the claims or elsewhere in the Specification based upon a specific reference to a modification of a term used in the following Glossary:

Glossary

The words "a", "an", and "the" are used interchangeably with "at least one" to mean one or more of the elements being described.

The term "layer" refers to any material or combination of materials on or overlaying a substrate.

The term "acrylic" refers to compositions of matter which have an acrylic or methacrylic moiety.

The term "photoinitiator" refers to a single species or a blend of species capable of initiating a polymerization reaction in response to the application of radiation.

Words of orientation such as "atop, "on," "covering," "uppermost," "overlaying," "underlying" and the like for describing the location of various layers, refer to the relative position of a layer with respect to a horizontally-disposed, upwardly-facing substrate. It is not intended that the substrate, layers or articles encompassing the substrate and layers, should have any particular orientation in space during or after manufacture.

The term "separated by" to describe the position of a layer with respect to another layer and the substrate, or two other layers, means that the described layer is between, but not necessarily contiguous with, the other layer(s) and/or substrate.

The term "(co)polymer" or "(co)polymeric" includes homopolymers and copolymers, as well as homopolymers or copolymers that may be formed in a miscible blend, e.g., by coextrusion or by reaction, including, e.g., transesterification. The term "copolymer" includes random, block, graft, and star copolymers.

Referring now to FIG. 1 a side view of an exemplary substrate 20 is illustrated. The substrate 20 has a first side 22 and a second side 24. While the illustrated embodiment depicts a coating only on first side 22, the casting techniques discussed below are adaptable to produce embodiments patterned on both sides if such are desired. Numerous substrates are suitable for use with the present disclosure provided they can pass the wavelengths used to cure the swellable acrylic compostions, with polyesters such as polyethylene terephthalate (PET), polyethylene naphthalate (PEN), and cyclical polyolefins (COP) being considered convenient. Substrates may be primed or unprimed.

Figure 2:
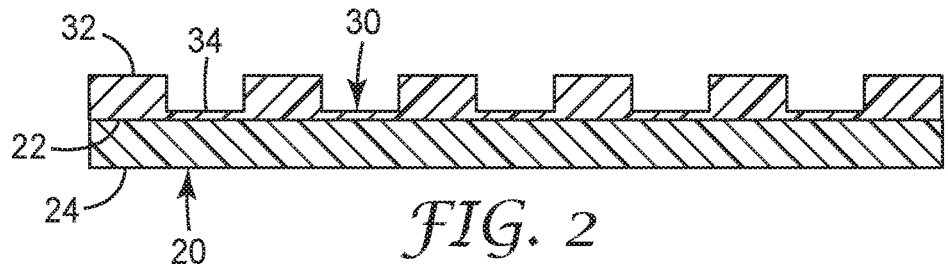
FIG. 2 is a side view of the substrate of FIG. 1 with the patterned coating of a swellable acrylic composition disposed on one side.

Referring now to FIG. 2 a side view of the substrate 20 of FIG. 1 with a patterned coating 30 of a swellable acrylic composition disposed on first side 22 is depicted. It will be seen that patterned coating 30 includes thick sections 32 and thin sections 34. Cast and cure techniques suitable for providing such a patterned coating are disclosed in U.S. Pat. No. 7,165,959 (Humlicek et al); U.S. Pat. Nos. 7,165,959; 7,224,529; 7,417,798; and 7,804,649, the entire contents of which are incorporated by reference as if rewritten. For convenience during coating, the viscosity of the polymerizable precursor may be less than 5000 centiPoise, or even less than 1000 cP, or even less than 500 cP.

Figure 3:
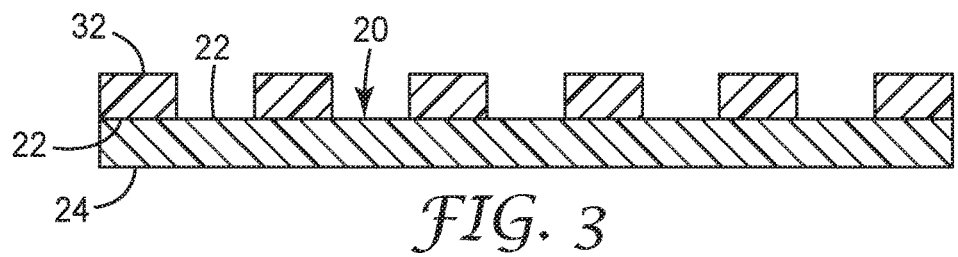
FIG. 3 is a side view of the substrate of FIG. 2 after an etching process has been performed to remove the thin portions of the patterned coating.

Referring now to FIG. 3, a side view of the substrate of FIG. 2 is illustrated after an etching process has been performed to remove the thin portions 34 of patterned coating 30. Sufficient etching has been performed so that the thin portions 34 are completely removed all the way down to the first side 22 of substrate 20.

Etching the thin portions 34 is conveniently accomplished with reactive ion etching (ME). Oxygen ions are considered suitable, conveniently generated from an oxygen flow of approximately 0.5 standard liters/minute, at 200 watts of RF power from between about 20 to 60 seconds at 60 to 80 mTorr. Fluorocarbon ion etching is also considered suitable.

Figure 4:
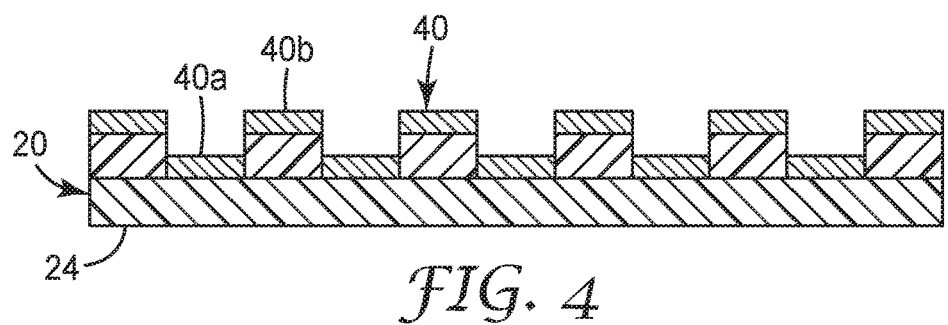
FIG. 4 is a side view of the substrate of FIG. 3 after a metallizing process has been performed.

Referring now to FIG. 4, a side view of the substrate of FIG. 3 is illustrated after a metallization process has been performed. It will be observed that a metal layer 40 has been deposited, divided into portions 40a that are disposed direction on first side 22, and portions 40b that are disposed upon the remaining thick portions 32 of patterned coating 30.

The metallization is conveniently accomplished by sputter deposition or vapor deposition. Diverse metals may be used, including copper, silver, gold, and aluminum, and their alloys.

Figure 5:
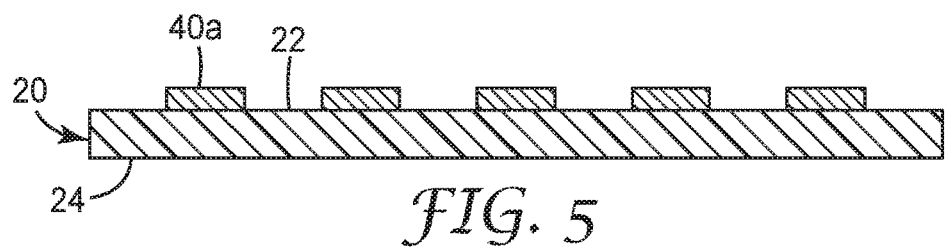
FIG. 5 is a side view of the substrate of FIG. 4 after a water wash has been used to remove the remaining portions of the patterned coating.

Referring now to FIG. 5, a side view of the substrate of FIG. 4 after a water wash has been used to remove the remaining portions of the patterned coating 30. The compositions discussed above swell during the water wash, loosening them from their attachment to first surface 22. When they swell and detach, they carry away portions 40b, leaving only portions 40a in firm attachment with substrate 20 in the pattern originally defined by the thin sections 34 of the patterned coating 30. It has been found convenient to perform the water wash at a temperature of between about 120 and 200° F.

Following are various, non-limiting exemplary embodiments and combinations of embodiments:

Embodiment A

A method of forming a predetermined metalized pattern on a substrate, comprising:
casting and curing a polymerizable precursor into a first side of the substrate so as to form a water swellable acrylic layer on the substrate, the water swellable acrylic layer having thick portions and thin portions such that the thin portions correspond to the predetermined pattern;
etching the water swellable acrylic layer so that the thin portions are removed and substrate is partially exposed;
metalizing the first side so as to deposit metal onto the exposed portions of the substrate and onto the thick portions of the water swellable acrylic layer; and
exposing the water swellable acrylic layer to water, releasing the water swellable acrylic layer and its over-coat of metal from the substrate and leaving the substrate with the predetermined metalized pattern.

Embodiment B

The method according to Embodiment A wherein the water swellable acrylic layer is at least about 300 microns in thickness.

Embodiment C

The method according to claim Embodiment A or B where in the polymerizable precursor comprises between about 30 to 95 parts by weight of a mono-alkoxy polyakylene glycol acrylate, between about 5 to 65 parts by weight of mono-, di-, or tri-acrylate, and between about 0.1 to 2.5 parts by weight of a photoinitiator.

Embodiment D

The method according to Embodiment A wherein the polymerizable precursor comprises a liquid, monomeric, acrylic resin.

Embodiment E

The method according to any of Embodiments A to D wherein the viscosity of the polymerizable precursor 5000 cP.

Embodiment F

A composition of matter, comprising:
a UV curable polymer precursor comprising
between about 30 to 95 parts by weight of a mono-alkoxy polyakylene glycol acrylate,
between about 5 to 65 parts by weight of mono-, di-, or tri-acrylate, and
between about 0.1 to 2.5 parts by weight of a photoinitiator.

Embodiment G

The composition of matter according to Embodiment F wherein the mono-, di-, or tri-acrylate is selected from the group consisting of polyalkelene glycol diacrylate monomer, hydroxy alkyl mono acrylate, and ethoxylated Bisphenol A diacrylate.

Embodiment H

The composition of matter according to Embodiments F or G wherein the polyalkelene glycol diacrylate monomer is polyethylene glycol 400 diacrylate.

Embodiment I

The composition of matter according to Embodiment G wherein the hydroxy alkyl mono acrylate is hydroxy ethyl acrylate.

Embodiment J

The composition of matter according to any of Embodiments F to I wherein the mono-alkoxy polyethylene glycol monoacrylate has a molecular weight above 500 Daltons.

Embodiment K

A water swellable acrylic polymer formed by UV polymerization of the composition of matter of any of Embodiments F to J.

Exemplary embodiments of the present disclosure have been described above and are further illustrated below by way of the following Examples, which are not to be construed in any way as imposing limitations upon the scope of the present disclosure. On the contrary, it is to be clearly understood that resort may be had to various other embodiments, modifications, and equivalents thereof which, after reading the description herein, may suggest themselves to those skilled in the art without departing from the spirit of the present disclosure and/or the scope of the appended claims.

EXAMPLES

The following examples are intended to illustrate exemplary embodiments within the scope of this disclosure. Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. At the very least, and not as an attempt to limit the application of the doctrine of equivalents to the scope of the claims, each numerical parameter should at least be construed in light of the number of reported significant digits and by applying ordinary rounding techniques.

EXAMPLES

Examples 1-3 and C1-C6—Screening of Candidate Resins

Candidate UV cureable acrylic resins were prepared as described in Table 1 below. All samples were 100 grams total, with 0.5 g (0.5%) of diphenyl (2,4,6-trimethylbenzoyl) phosphine oxide (TPO) photoinitiator, commercially available as LUCIRIN TPO from BASF of Ludwigshafen, Del., added. The samples were placed on a roller and heated gently to homogenize them. The candidate resins were coated onto 5 mil (0.012 mm) thick PET film, commercially available as MELINEX 618 from DuPont Teijin Films of Chester, Va., using a Mayer Rod coater to provide 4 mil (0.10 mm) thick coatings. These coated films were passed through a 500 watt UV irradiation station commercially available as LIGHTHAMMER 6 from Heraeus Noblelight Fusion UV Inc. of Gaithersburg, Md. The apparatus was operated using D Bulbs at 100% power at room temperature, under a nitrogen purge at a line speed of 25 ft/min (7.62 m/min).

TABLE 1

Components listed as percent by weight of total composition

| | Monomer component | | | | | |
|---|---|---|---|---|---|---|
| Sample # | Aldrich CD553 550 mw PEG monomethyl ether mono-acrylate | Aldrich CD551 350 mw PEG monomethyl ether mono-acrylate | 2-Acrylamido-2-methylpropane sulfonic acid | Sartomer SR 602 Ethoxylated (10) Bisphenol A diacrylate | Hydroxy ethyl acrylate | Sartomer SR 306 Tripropylene glycol diacrylate |
| 1 | 50 | | | 30 | 10 | 10 |
| 2 | 40 | | | 30 | 10 | 20 |
| C1 | 30 | | | 30 | 10 | 30 |

TABLE 1-continued

Components listed as percent by weight of total composition

| | Monomer component | | | | | |
|---|---|---|---|---|---|---|
| Sample # | Aldrich CD553 550 mw PEG monomethyl ether monoacrylate | Aldrich CD551 350 mw PEG monomethyl ether monoacrylate | 2-Acrylamido-2-methylpropane sulfonic acid | Sartomer SR 602 Ethoxylated (10) Bisphenol A diacrylate | Hydroxy ethyl acrylate | Sartomer SR 306 Tripropylene glycol diacrylate |
| C2 | 50 | | | 30 | 10 | 10 |
| C3 | 40 | | | 30 | 10 | 20 |
| C4 | 30 | | | 30 | 10 | 30 |
| C5 | | | 40 | 40 | 10 | 10 |
| C6 | | | 30 | 40 | 10 | 20 |
| C7 | | | 20 | 40 | 10 | 30 |

Comparative samples C5-C7 were not homogeneous and yielded hazy looking films with little or no adhesion to the substrate. Samples 1-2 and C1-C4 yielded nice looking clear films. A sample of each of them was subjected to a cross-hatch adhesion trial, and all had little or no loss of the acrylic film, indicating good adhesion to the substrate PET film.

Next, samples 1-3 and C1-C4 were placed under a stream of hot running tap water. In less than one minute of exposure, the acrylic portion of samples 1 and 2 swelled and was able to be completely washed off the PET substrate. Samples C1-C4 showed no tendency to swell in the same way.

Examples 3, 4, C8—Production of Cast Resin on a Substrate

An apparatus generally as described in U.S. Pat. No. 7,165,959 was set up with the following parameters. The coating trials were run using the following process parameters:

Tool temperature 100° F. (37.8° C.)
Nip Pressure 40 psi (0.28 MPa)
Web substrate: 5 mil (0.012 mm) thick primed PET
UV LED 30 watts, high intensity
Web line speeds: 20 feet per minute (6.1 m/min)
The microreplication tool roll contained a challenge pattern with narrow gaps between pads to be metalized.

Three resin formulations were produced, designated 3, 4, and C8. All had 50 grams of a monomethyl ether PEG mono acrylate, 30 grams Sartomer SR 602, 10 grams Sartomer SR 306, 10 grams hydroxy ethyl acrylate, and TPO photoinitiator. More specifically, the monomethyl ether PEG mono acrylate in samples 3 and 4 was Sartomer CD 553. The monomethyl ether PEG mono acrylate in sample C8 was Aldrich catalog 454990. Samples 3 and C8 used 0.1% TPO, while Sample 4 used 0.25% TPO. All the formulations were mixed in an amber jar and gently heated to fully homogenize and dissolve the photoinitiator.

The substrate was threaded up on the apparatus, and Samples 3, 4, and C8 were cast and cured onto the substrate, forming an approximately 4 micron thick microreplicated cured acrylic patterned film on the substrate. All of these cast films came off the tool without difficulty, and all had adequate adhesion to the substrate.

Sample 3 showed rapid and complete lift-off of the acrylic film from the substrate when exposed to running hot water. Sample 4 showed slight lift-off of the acrylic film from the substrate when exposed to running hot water. Sample C8 showed no lift-off of the acrylic film from the substrate when exposed to running hot water.

Example 3A—Etching and Metalizing

The substrate bearing its cast film produced in Example 3 was exposed to reactive ion etching to remove the thin portions of the cast resin. More specifically, oxygen ions were generated from an oxygen flow of 0.5 standard liters/min by 200 watts of RF power. The substrate was exposed for 80 seconds between 60 to 80 mTorr. This regimen etched away the thin portions, while retaining the thick portions of the cast resin. Next a layer of aluminum metal was laid down over the thick portions of the resin and the surface of the substrate exposed by the etching. This was accomplished by sputter deposition off an aluminum target for 3 minutes at 40 mA. The metal layer was then washed with hot water from a pressurized spray, removing the thick portions of the cured resin and the metal adhered to its exposed surface. A patterned metal layer, showing good fidelity to the pattern on the microreplication tool, was left on the substrate.

Example 5—Using Ethoyxylated Trimethylolpropane Triacrylate

A sample was made generally as described for Example 3, except that the resin formulation comprised 90 parts of Sartomer CD 553, 10 parts of ethoyxylated trimethylolpropane triacrylate, commercially available as SARTOMER 602 from Sartomer of Exton, Pa., and 0.10 parts of TPO as photoinitiator. The sample showed good swelling and lift off when exposed to the hot water spray.

While the specification has described in detail certain exemplary embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove. Furthermore, all publications, published patent applications and issued patents referenced herein are incorporated by reference in their entirety to the same extent as if each individual publication or patent was specifically and individually indicated to be incorporated by reference. Various exemplary embodiments have been described. These and other embodiments are within the scope of the following listing of disclosed embodiments.

What is claimed is:

1. A method of forming a predetermined metalized pattern on a substrate, comprising:
    casting and curing a polymerizable precursor into a first side of the substrate so as to form a water swellable acrylic layer on the substrate, the water swellable acrylic layer having thick portions and thin portions such that the thin portions correspond to the predetermined pattern;

etching the water swellable acrylic layer so that the thin portions are removed and substrate is partially exposed;

metalizing the first side so as to deposit metal onto the exposed portions of the substrate and onto the thick portions of the water swellable acrylic layer; and exposing the water swellable acrylic layer to only hot water, releasing the water swellable acrylic layer and its over-coat of metal from the substrate and leaving the substrate with the predetermined metalized pattern.

2. The method according to claim 1 wherein the water swellable acrylic layer is at least about 0.3 microns in thickness.

3. The method according to claim 1 where in the polymerizable precursor comprises between about 30 to 95 parts by weight of a mono-alkoxy polyakylene glycol acrylate, between about 5 to 65 parts by weight of mono-, di-, or tri-acrylate, and between about 0.1 to 2.5 parts by weight of a photoinitiator.

4. The method according to claim 1 wherein the polymerizable precursor comprises a liquid, monomeric, acrylic resin.

5. The method according to claim 1 wherein the viscosity of the polymerizable precursor 5000 centiPoise.

\* \* \* \* \*

UNITED STATES PATENT AND TRADEMARK OFFICE
CERTIFICATE OF CORRECTION

PATENT NO. : 10,167,546 B2  
APPLICATION NO. : 15/558384  
DATED : January 1, 2019  
INVENTOR(S) : John Strand Page 1 of 1

It is certified that error appears in the above-identified patent and that said Letters Patent is hereby corrected as shown below:

In the Specification

<u>Column 1</u>
Line 57, Delete "polyalkelene" and insert -- polyalkylene --, therefor.
Line 65, Delete "polyakylene" and insert -- polyalkylene --, therefor.

<u>Column 3</u>
Line 59 (approximately), Delete "compostions," and insert -- compositions, --, therefor.

<u>Column 4</u>
Line 13, Delete "(ME)." and insert -- (RIE). --, therefor.

<u>Column 5</u>
Lines 1-2, Delete "polyakylene" and insert -- polyalkylene --, therefor.
Line 23, Delete "polyakylene" and insert -- polyalkylene --, therefor.
Line 33 (approximately), Delete "polyalkelene" and insert -- polyalkylene --, therefor.
Line 40 (approximately), Delete "polyalkelene" and insert -- polyalkylene --, therefor.

<u>Column 6</u>
Line 37 (approximately), Delete "cureable" and insert -- curable --, therefor.

<u>Column 8</u>
Line 38 (approximately), Delete "Ethoyxylated" and insert -- Ethoxylated --, therefor.
Line 43 (approximately), Delete "ethoyxylated" and insert -- ethoxylated --, therefor.

In the Claims

<u>Column 9</u>
Line 19, In Claim 3, delete "polyakylene" and insert -- polyalkylene --, therefor.

Signed and Sealed this  
Third Day of March, 2020

Andrei Iancu  
*Director of the United States Patent and Trademark Office*